(12) United States Patent
Tan et al.

(10) Patent No.: US 11,791,607 B2
(45) Date of Patent: *Oct. 17, 2023

(54) DRIVER FOR HIGH SPEED LASER DIODE

(71) Applicant: Maxim Integrated Products, Inc., San Jose, CA (US)

(72) Inventors: Qingsheng Tan, Portland, OR (US); James Cong Nguyen, Portland, OR (US); Ashok K. Verma, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 114 days.

This patent is subject to a terminal disclaimer.

(21) Appl. No.: 17/223,382

(22) Filed: Apr. 6, 2021

(65) Prior Publication Data

US 2021/0288466 A1 Sep. 16, 2021

Related U.S. Application Data

(63) Continuation of application No. 15/187,439, filed on Jun. 20, 2016, now Pat. No. 10,971,894.

(Continued)

(51) Int. Cl.
*H01S 5/042* (2006.01)
*H01S 5/02212* (2021.01)
(Continued)

(52) U.S. Cl.
CPC ........ *H01S 5/0427* (2013.01); *H01S 5/02212* (2013.01); *H01S 5/06226* (2013.01); *H01S 5/06832* (2013.01)

(58) Field of Classification Search
CPC .............................. H01S 5/042; H01S 5/0427
See application file for complete search history.

(56) References Cited

U.S. PATENT DOCUMENTS 7,049,759 B2 * 5/2006 Roach .................... H05B 45/40
315/169.1
7,193,463 B2 * 3/2007 Miyashita ........... H03F 3/45085
330/252

(Continued)

FOREIGN PATENT DOCUMENTS

CN 101043122 A 9/2007
CN 101926082 A 12/2010
(Continued)

OTHER PUBLICATIONS

Office Action for Chinese Application No. 201610575540.1, dated Dec. 7, 2020,.

(Continued)

*Primary Examiner* — Tod T Van Roy
(74) *Attorney, Agent, or Firm* — Kevin E. West; Advent, LLP

(57) ABSTRACT

Various embodiments of a laser driver are described herein. In an embodiment, a laser driver system includes: an external set of inductors including a first external inductor and a second external inductor; an internal set of inductors including a first internal inductor and a second internal inductor; and a DC-to-DC convertor configured to bias a first output path defined by the first external inductor and the first internal inductor and a second output path defined by the second external inductor and the second internal inductor.

8 Claims, 9 Drawing Sheets

Related U.S. Application Data

(60) Provisional application No. 62/183,010, filed on Jun. 22, 2015.

(51) Int. Cl.
 *H01S 5/0683* (2006.01)
 *H01S 5/062* (2006.01)

(56) References Cited

U.S. PATENT DOCUMENTS

| | | | | |
|---|---|---|---|---|
| 7,391,797 | B2* | 6/2008 | Schrodinger | H01S 5/042 372/38.07 |
| 8,571,079 | B1* | 10/2013 | Nguyen | H01S 5/0683 372/38.07 |
| 8,971,365 | B2* | 3/2015 | Nguyen | H03K 19/01837 372/38.02 |
| 9,209,599 | B2* | 12/2015 | Nguyen | H03K 19/01837 |
| 10,461,498 | B2* | 10/2019 | Zhang | H01S 5/0428 |
| 10,971,894 | B2* | 4/2021 | Tan | H01S 5/0427 |
| 11,133,647 | B2* | 9/2021 | Yi | H01S 5/02415 |
| 2005/0088233 | A1* | 4/2005 | Miyashita | H03F 3/45085 330/252 |
| 2005/0243878 | A1* | 11/2005 | Murata | H01S 5/042 372/38.07 |
| 2006/0204168 | A1* | 9/2006 | Douma | H01S 5/042 385/14 |
| 2007/0023766 | A1* | 2/2007 | Aruga | H01S 5/02212 257/98 |
| 2009/0238226 | A1* | 9/2009 | Moto | H01S 5/042 372/38.02 |
| 2010/0183318 | A1* | 7/2010 | Tanaka | H04B 10/504 398/201 |
| 2012/0113999 | A1* | 5/2012 | Tanaka | H01S 5/06213 372/38.02 |
| 2012/0201260 | A1* | 8/2012 | Nguyen | H03K 19/01837 372/38.02 |
| 2013/0121356 | A1* | 5/2013 | Sugawara | H05B 45/10 315/172 |
| 2015/0188288 | A1* | 7/2015 | Nguyen | H01S 5/042 372/38.02 |
| 2016/0372888 | A1* | 12/2016 | Tan | H01S 5/0427 |
| 2021/0288466 | A1* | 9/2021 | Tan | H01S 5/0427 |

FOREIGN PATENT DOCUMENTS

| | | |
|---|---|---|
| CN | 102064468 A | 5/2011 |
| CN | 103348544 A | 10/2013 |
| CN | 103457153 A | 12/2013 |

OTHER PUBLICATIONS

Office Action for Chinese Application No. 201610575540.1, dated Jan. 20, 2020.

Office Action for Chinese Application No. 201610575540.1, dated Mar. 22, 2021.

Office Action for Chinese Application No. 201610575540.1, dated Jul. 1, 2019.

Office Action for Chinese Patent Application No. 201610575540.1, dated Jul. 27, 2020.

* cited by examiner

DRIVER FOR HIGH SPEED LASER DIODE

CROSS-REFERENCE TO RELATED APPLICATIONS

The present application is a continuation of U.S. Non-Provisional patent application Ser. No. 15/187,439, filed on Jun. 20, 2016, titled "DRIVER FOR HIGH SPEED LASER DIODE," which claims the benefit under 35 U.S.C. § 119(e) of U.S. Provisional Application Ser. No. 62/183,010, filed Jun. 22, 2015, titled "DRIVER FOR HIGH SPEED LASER DIODE." U.S. Non-Provisional patent application Ser. No. 15/187,439 and Provisional Application Ser. No. 62/183,010 are hereby incorporated by reference in their respective entireties.

BACKGROUND

The choice of laser driving scheme strongly affects the competitiveness of high speed optical modules, including optical performance, module power consumption, channel density, and solution cost. From circuit design point of view, a differential driver output stage is preferred for a fast signal transition of driving current. One underlying pre-condition is that the common-mode level of the two outputs should be similar to form a symmetric push-pull structure. Another advantage of a shared common-mode level is a restrained electro-magnetic radiation, avoiding interference to system receivers.

Existing differential drive architectures rely on AC-coupling the differential outputs of the driver to the laser anode and cathode of the Transmitter Optical Sub-Assembly (TOSA). External inductors are typically required to provide a bias to the two driver outputs, and a bias current to the laser. External resistors in parallel with the inductors are often found necessary to reject possible overshoot and ringing in laser current. This leads to an external component count of ten or more for a single transmitter assembly. AC-coupled driver-laser interface makes it possible to bias the laser anode at a voltage close to laser forward voltage without concern on driver headroom. This helps reduce overall transmitter power consumption. However, a negative impact of using these external components is that a large module board space may be required for PCB assembly, which causes a great challenge in designing a multi-channel optical module. It is also found difficult to manage the impact on high speed transmitter performance introduced by parasitics from these external components and assembly.

One alternative laser driver practice is to assemble the driver directly to the laser in chip form, often referred as internal drive. Due to its nature of being DC-coupled, this approach avoids the disadvantages showed in an AC-coupled interface. But since the drive is very close to the laser in this case, heat generated by the driver will increase the operating temperature of the laser, requiring a higher laser bias current and modulation current to compensate for laser threshold increase and slope efficiency reduction, eventually deteriorating module power consumption. Additionally, such an assembly does not align with conventional laser packaging techniques, for instance, transistor outline (TO) based TOSAs. This can increase solution cost, as it uses multiple wire bonds which could lead to a potential risk in TOSA assembly yield and assembly line production rate.

SUMMARY

In embodiments of this disclosure, a laser driver system can include: an external set of inductors including a first external inductor and a second external inductor; an internal set of inductors including a first internal inductor and a second internal inductor; and a DC-to-DC convertor configured to bias a first output path defined by the first external inductor and the first internal inductor and a second output path defined by the second external inductor and the second internal inductor. The first output path can be coupled to a first input of a transmitter optical sub-assembly (TOSA), and the second output path can be coupled to a second input of the TOSA. The first input of the TOSA can feed into a first input path including a first inductor positioned before a laser diode and a second inductor positioned after the laser diode. The second input of the TOSA can feed into a second input path including a resistor coupled to the second inductor. The second input path can further include an external or internal capacitor positioned before the resistor. This laser driver system architecture can allow for a reduced set of external components and a low resistance drive path for improved optical performance and efficiency.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

FIGS. 1A through 8 illustrate various embodiments of a laser driver and transmitter assembly architecture that exhibits advantages of conventional AC-coupled laser driver systems, and yet, the disclosed laser driver architecture can be implemented with a reduced set of external components. In this regard, the disclosed laser driver and transmitter assembly also exhibits some advantages of a DC-coupled laser driver system without sacrificing performance or efficiency of the optical system.

Some advantages and features of the disclosed laser driver architecture include: a reduced set of discrete components on the high speed path between the laser driver and the TOSA, resulting in improved signal integrity and a reduced module component count; driver output stage is at a full differential mode for a good RF performance; driver has single-ended back-terminations to help reduce electromagnetic interference (EMI); driver output stage can be biased at a lower voltage to save transmitter (TX) power; architecture is adaptive to laser polarity (i.e., interchangeable between two driver outputs and TOSA high speed terminals); one or more inductors can be assembled in the TOSA; and applications are not limited to TO-based TOSAs (i.e., other high performance TOSAs can be used).

Example Implementations

Figure 1A:
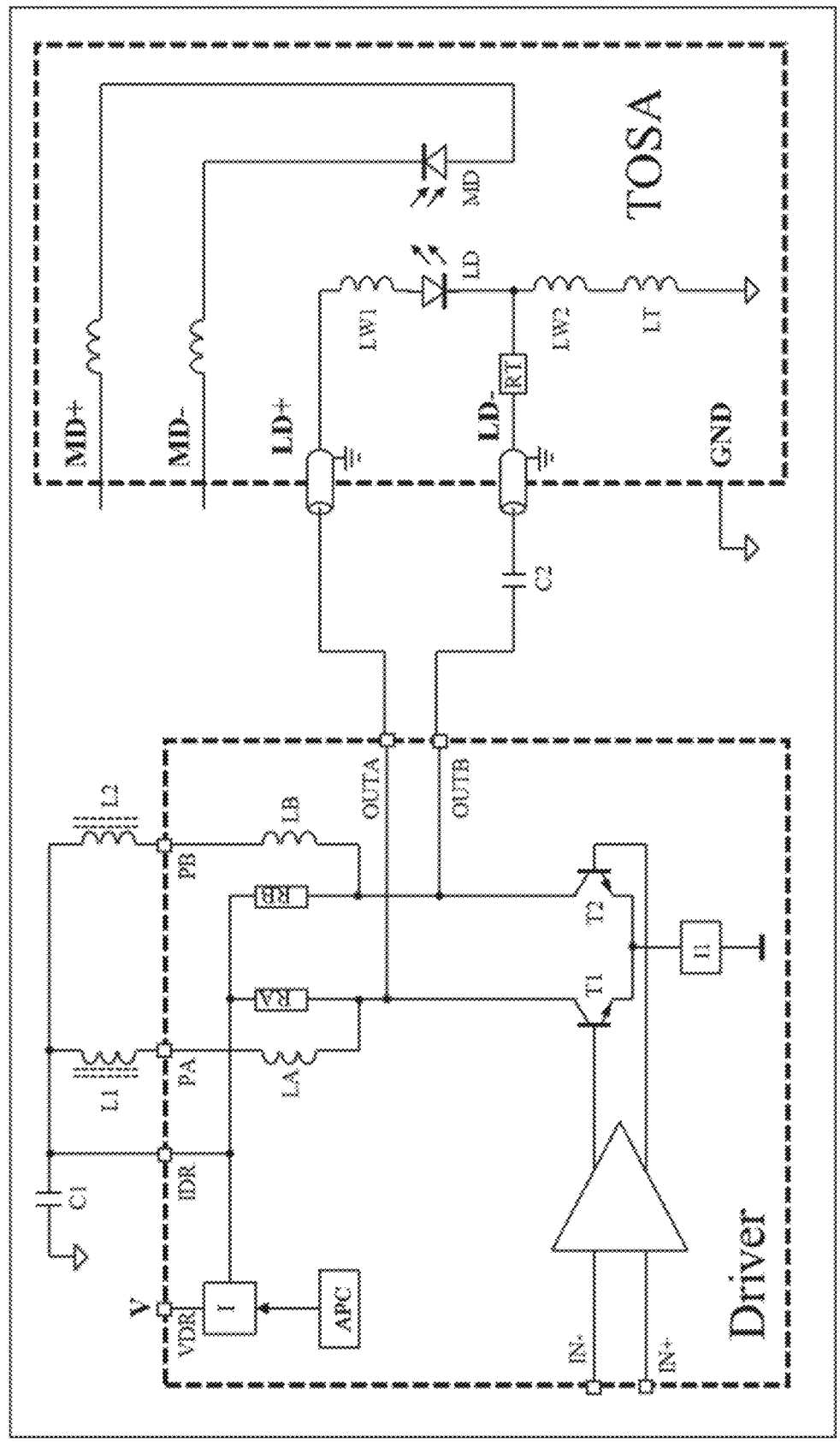
FIG. 1A is a circuit schematic illustrating a laser driver architecture in accordance with an embodiment of this disclosure.

A laser driver system in accordance with embodiments of this disclosure is shown in FIG. 1A. An optical transmitter (e.g., a laser) can include a laser driver (Driver) and a transmitter optical sub-assembly (TOSA), as well as a relatively small number of discrete components. Differential input signal at IN+ and IN− pins of the driver is applied to a differential pair of transistors (T1 and T2), coupled with a circuit generating a constant current of I1. The differential outputs (OUTA and OUTB) are to drive the laser. Two on-chip inductors (LA and LB) and two external inductors or ferrite beads (L1 and L2) are to bias the driver outputs, while also to provide a path for laser bias current. The on-chip inductors LA and LB can reduce capacitive load of the differential outputs introduced by a second pin (PA or PB) connected to each of the modulation outputs, while the external inductors or ferrite beads provide a low-frequency cut-off low enough so the transmitter delivers a proper performance for an input signal with a long consecutive-identical-digit (CID). The collectors of T1 and T2 are biased at a same voltage to achieve an optimal operation for the differential pair. An on-chip circuit (current source I) generating a constant current is coupled to the collectors of the differential pair through L1 and L2. An average power control (APC) circuit adjusts the value of I so the TOSA monitor current reaches a predetermined value. Two resistors (RA and RB) provide a back-termination to absorb reflection at the driver outputs. The resisters are connected to one external capacitor (C1) to provide a good common-mode termination to help minimize electromagnetic interference (EMI).

In some embodiments, the TOSA including a laser diode (LD) and a monitor diode (MD) is assembled in a high speed package, either a TO-based or using a hybrid substrate. FIG. 1A shows one example of such a package with 5 pins: LD+ and LD− high speed pins with impedance controlled for driving the laser; MD+ and MD− pins for monitor diode connection; and GND pin which is the TOSA case served as AC ground. LW1 and LW2 present wire bond inductances from the assembly. LW2, together with a discrete inductor LT assembled inside of the TOSA, provides a path for laser bias current, and isolation to high speed signal. One serial resistor (RT) in high speed signal path can be implemented in the TOSA in such a way that the combined resistance of RT and the laser equivalent resistance closely matches the impedance of the transmission line. This can potentially reduce signal reflection from the TOSA.

When such a laser driver and TOSA are connected together, only one capacitor (C2) is necessary on the high-speed traces between the driver outputs and the TOSA, eliminating the need for pull-up and pull-down components at driver outputs and the laser anode and cathode nodes.

When the circuit reaches its equilibrium mode, the current of I ($I_{BIAS}+(1+k)\cdot I_{MOD}$) is shared between PA and PB pins of the driver, and maintained as $$I_{BIAS} + \frac{1+k}{2} \cdot I_{MOD}$$

and $$\frac{1+k}{2} \cdot I_{MOD}$$

respectively, as a result of connection to the TOSA. K (between 0 and 1) is a current split ratio, depending on the value of the back-termination resistors (RA and RB), with respect to the TOSA load. When the back-termination resistance is infinite, k=0; When RA and RB match the TOSA AC load, k=1. The laser bias current ($I_{BIAS}$) flows through the internal inductor LA, delivered to the TOSA LD+ terminal connected to the OUTA pin. Due to the existence of C2 at TOSA LD− pin, the bias current ($I_{BIAS}$) returns to ground through TOSA internal inductor LT.

Figure 2:
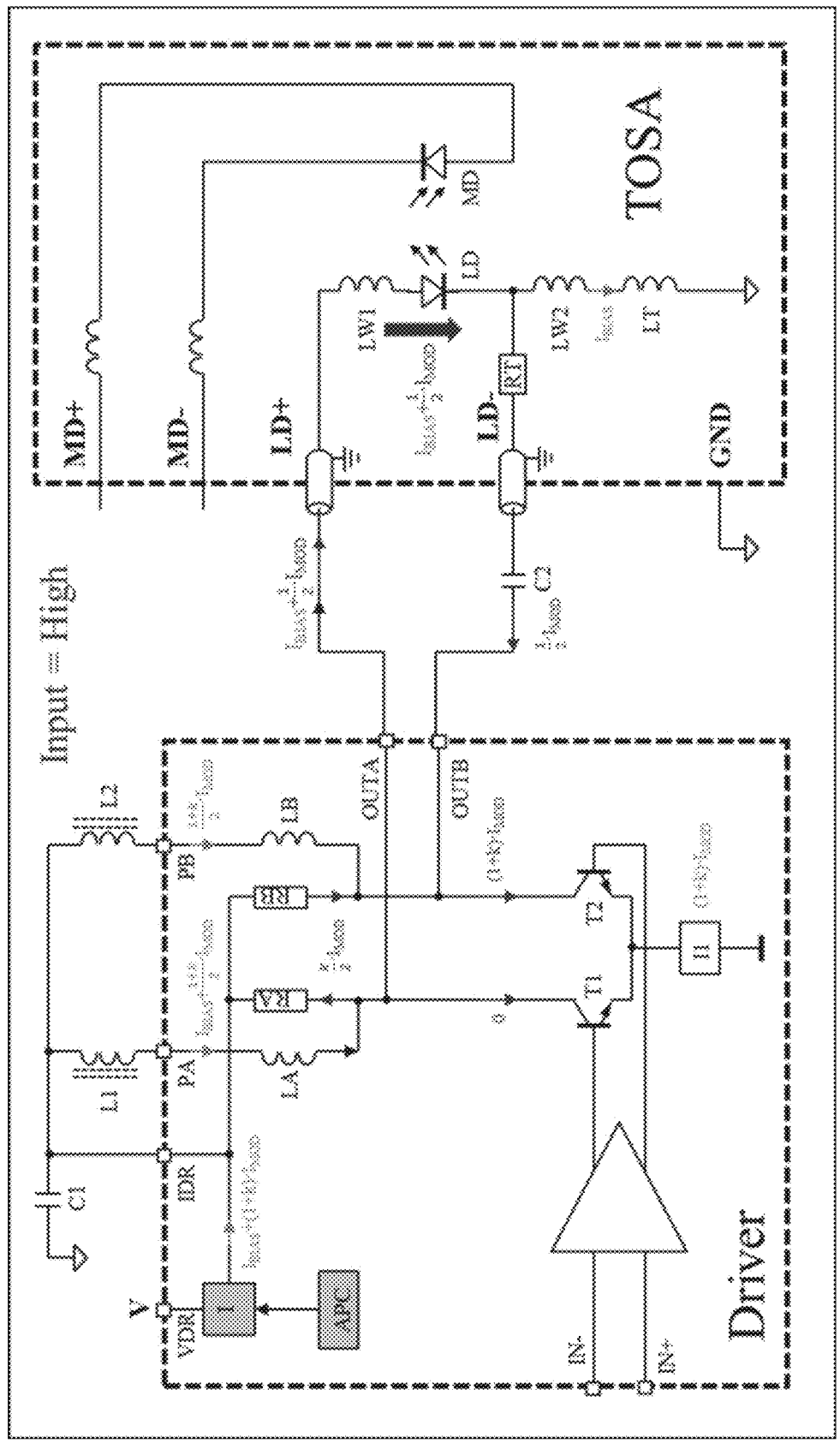
FIG. 2 is a circuit schematic illustrating a laser driver architecture in accordance with an embodiment of this disclosure, wherein current flow is illustrated when differential input is high.

FIG. 2 illustrates current flow through the system when differential input is high (e.g., optical output at "1"). When differential input signal is high (T1 is off and T2 is on), an AC component with an amplitude of $$\frac{1}{2} \cdot I_{MOD}$$

in the LA branch flows out of the OUTA pin, into the LD+ pin of the TOSA. The total current through the laser is $$I_{BIAS} + \frac{1}{2} \cdot I_{MOD},$$

so the laser output is at its optical high-level. Due to the nature of high AC impedance of the branch consisting of LW2 and LT, this AC component flows out of the LD− pin of the TOSA, through the external capacitor C2 returning into the OUTB pin. Since T1 is at its off state, an AC current of $$\frac{k}{2} \cdot I_{MOD}$$

flows through RA and RB. Combined with the current of $$\frac{1+k}{2} \cdot I_{MOD}$$

from the LB branch, the total current through T2 is $(1+k) \cdot I_{MOD}$, as set by the device (I1) at the differential pair.

Figure 3:
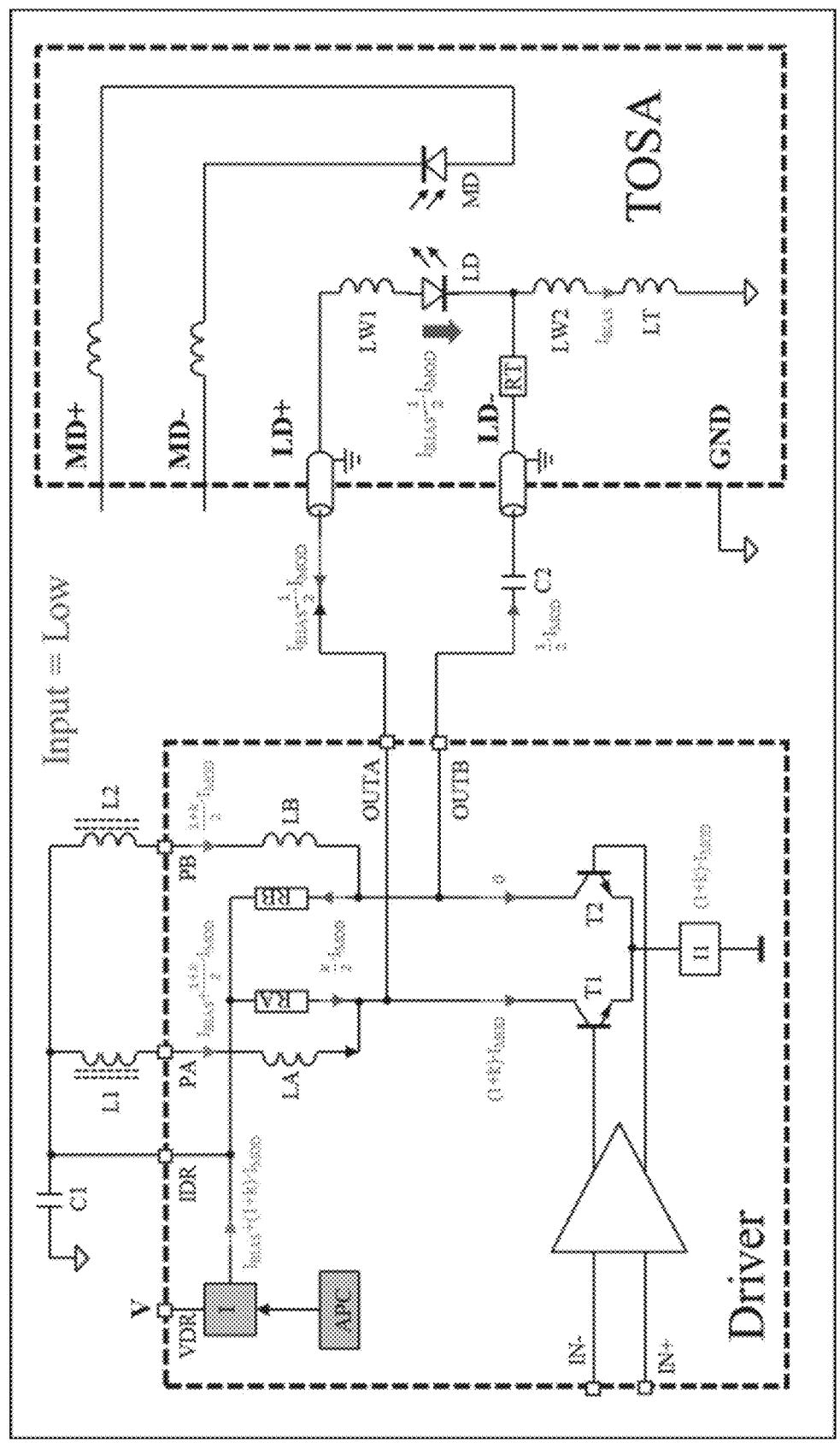
FIG. 3 is a circuit schematic illustrating a laser driver architecture in accordance with an embodiment of this disclosure, wherein current flow is illustrated when differential input is low.

FIG. 3 illustrates current flow through the system when differential input is low (e.g., optical output at "0"). When the input signal is at logic low, an equivalent AC current of $$\frac{1}{2} \cdot I_{MOD}$$

from the LB branch flows out of the OUTB pin of the driver, through the AC-coupling capacitor C2 and the laser loop back to OUTA pin. The total current to the laser becomes $$I_{BIAS} - \frac{1}{2} \cdot I_{MOD},$$

so the laser output is at its optical low-level. Since T2 is at its off state, an AC current of $$\frac{k}{2} \cdot I_{MOD}$$

flows through RB and RA. Combined with the AC current of $$\frac{1+k}{2} \cdot I_{MOD}$$

from the LA branch, the total current through T1 is $(1+k) \cdot I_{MOD}$, as set by the device (I1) at the differential pair.

It is noted that both the collectors of the differential transistors T1 and T2 are biased at a same voltage, so the output stage works at a full differential mode for improved high-speed performance and EMI control. Since the TOSA matching resistor RT is not in the laser bias loop, it reduces TOSA high-frequency reflection without scarifying additional transmitter power consumption and driver headroom. The common-mode voltage at LD+ pin, which is the same as that at driver outputs, is one laser forward-voltage or slightly higher, which leaves enough room for the driver output stage to work properly without a risk of insufficient headroom.

The voltage (V) at VDR pin supplying the current generator device (I) only needs a sub-volt above the laser forward voltage to ensure that the current source operates properly, taking into account the voltage drop over inductors. This voltage is potentially lower than Vcc (+3.3V, for instance), reducing the overall module power consumption.

In embodiments, the voltage or current source supplying VDR/IDR includes or is coupled with a DC-to-DC converter that is controlled by an automatic power control (APC) circuit such that the bias voltage is maintained at a level needed to drive the inductive path going to the anode of the laser diode. For example, similar DC-to-DC conversion circuitry is described in U.S. Pat. No. 8,571,079, which is incorporated herein by reference in its entirety.

In some embodiments, there is only one capacitor (C2) in the high-speed path between the driver and the TOSA, resulting in a very easy design and layout for the transmitter and minimizing risks in deteriorating signal integrity. A trade-off can be made to select a proper value for back-termination resistors (RA and RB) to reduce consumption-to-modulation current while still maintaining reasonable absorption to TOSA reflection.

Figure 1B:
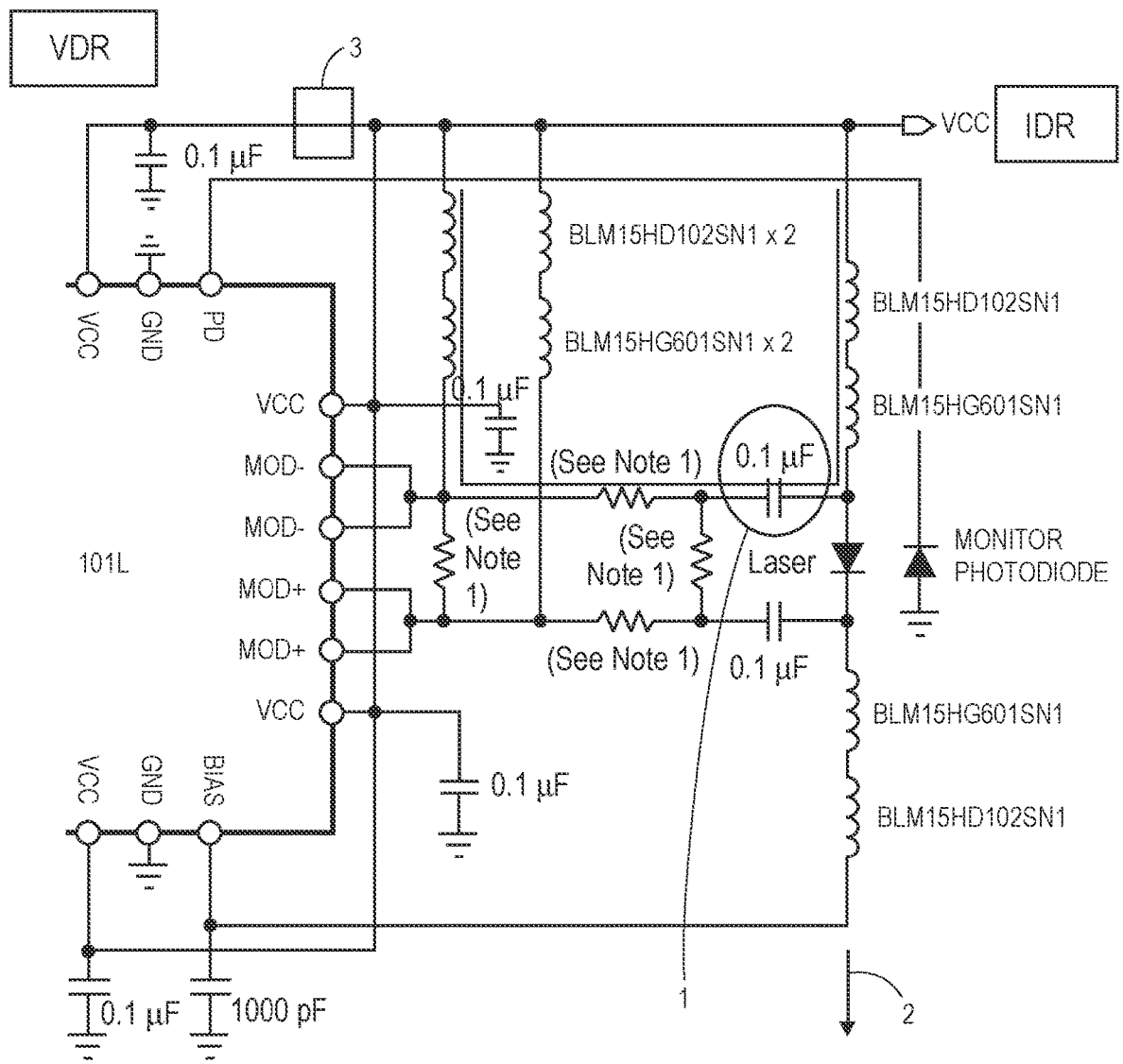
FIG. 1B is a circuit schematic illustrating an example of a conventional laser driver architecture.

FIG. 1A summarizes some structural features of the disclosed laser driver architecture that are distinguishable from a conventional laser driver (FIG. 1B, identified by portions 1, 2, and 3). For example, differences include: (1) reduction of components (e.g., resistors and capacitors) in between the laser driver outputs and TOSA inputs. This provides a more direct path with less resistance for increased power transfer efficiency. Additionally, (2) the input path of the TOSA can be tied to a bias ground of the TOSA, and (3) the circuit can be biased and driven from the topside by the DC-to-DC conversion circuit output (IDR). These combined features provide for a low cost, low profile laser driver circuit, wherein the overall architecture and the reduced number of components enables efficient, high speed power transfer through the circuit for driving the TOSA laser diode.

Figure 4:
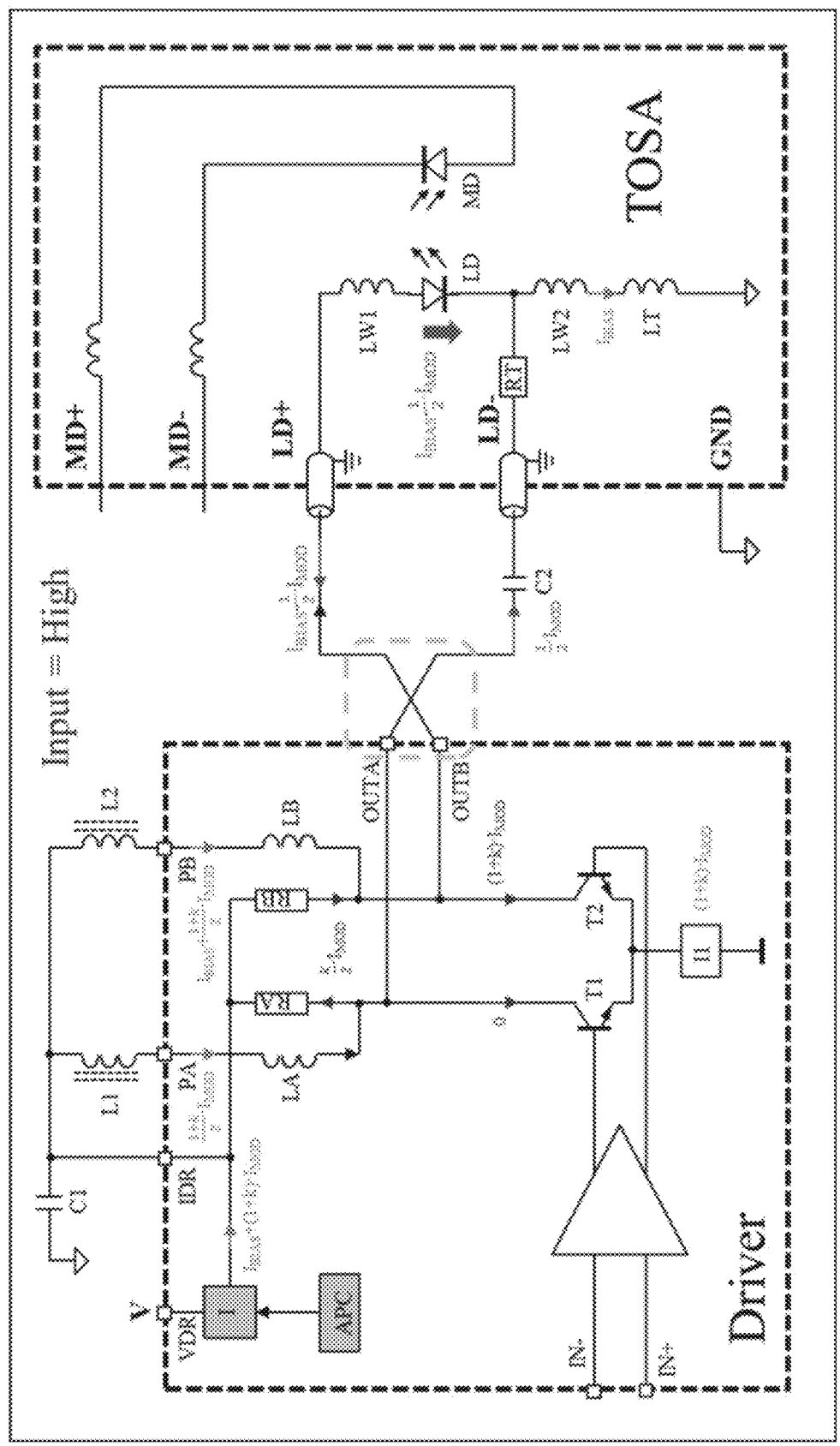
FIG. 4 is a circuit schematic illustrating a laser driver architecture in accordance with an embodiment of this disclosure, wherein the driver outputs and the laser inputs are interchangeably connectable, and wherein current flow is illustrated when differential input is high.
Figure 5:
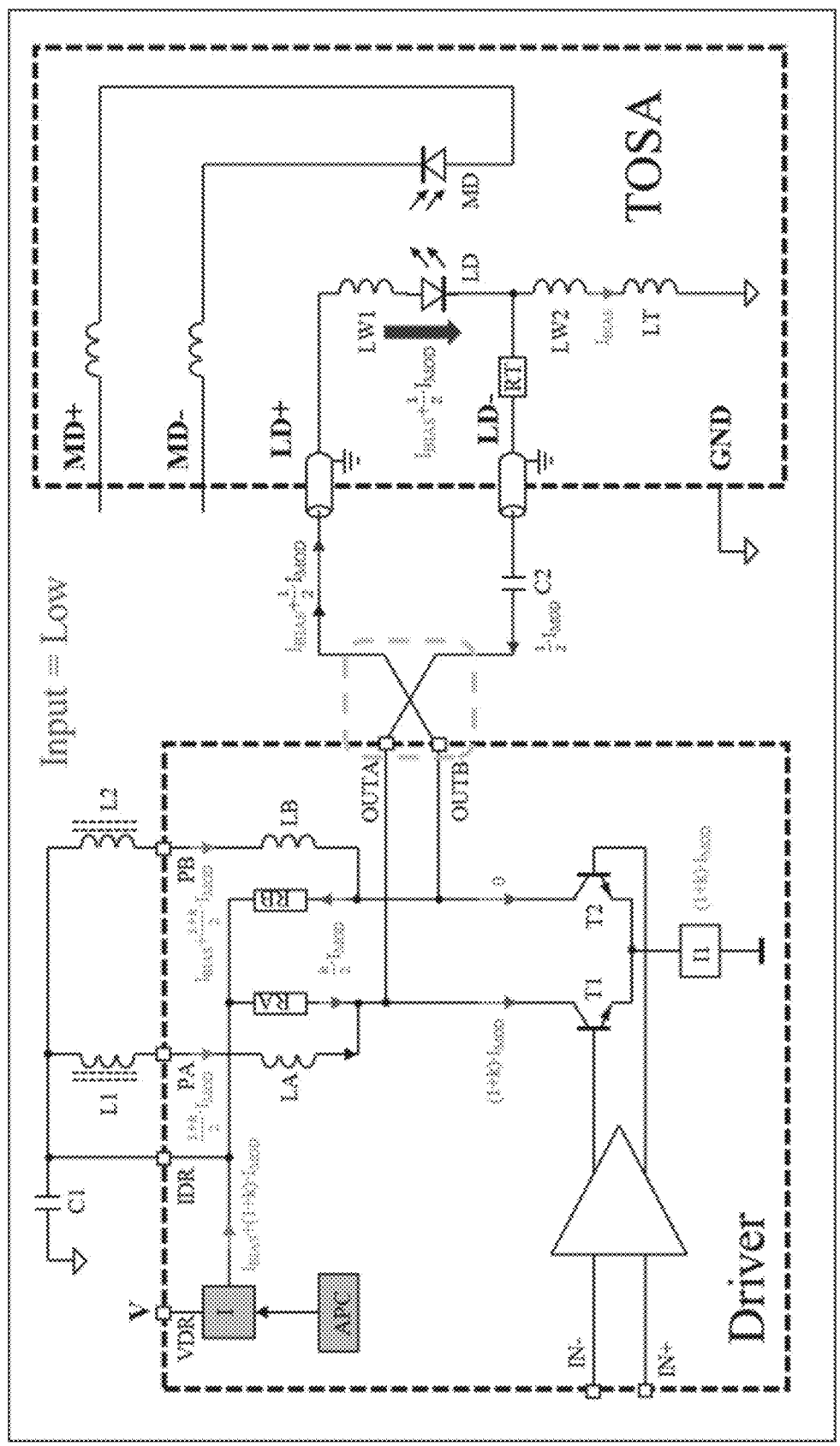
FIG. 5 is a circuit schematic illustrating a laser driver architecture in accordance with an embodiment of this disclosure, wherein the driver outputs and the laser inputs are interchangeably connectable, and wherein current flow is illustrated when differential input is low.

In embodiments, the laser driver is also adaptive to TOSA polarity. FIGS. 4 and 5 demonstrate how the laser bias current and modulation current flow between the driver and the TOSA, when swapping the connection of driver outputs (OUTA and OUTB) and laser inputs (LD+ and LD−). It is noticed that the circuit is adaptive to TOSA connection. Each of the two output pins can drive the TOSA anode pin or cathode pin. This feature is specifically useful for a multi-channel module design, where the TOSA polarity might vary from channel to channel. FIG. 4 illustrates current flow through the system when differential input is high (e.g., optical output at "0"), and FIG. 5 illustrates current flow through the system when differential input is low (e.g., optical output at "1").

Figure 6:
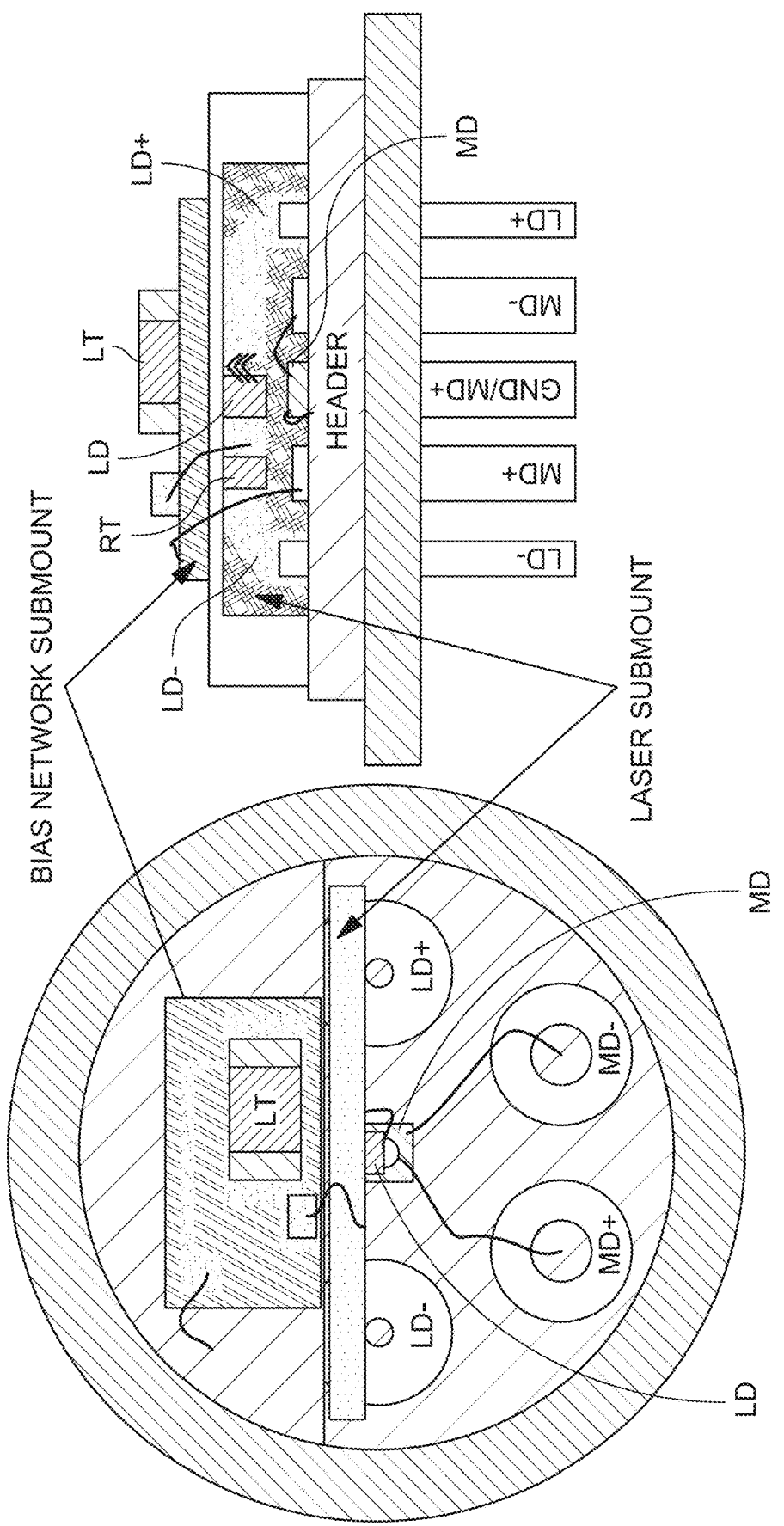
FIG. 6 illustrates an embodiment of a TOSA (e.g., TO-based TOSA) header that can be used for an implementation of the laser driver architecture described herein (e.g., embodiments shown in FIGS. 1A, 2, 3, 4, and 5).
Figure 7:
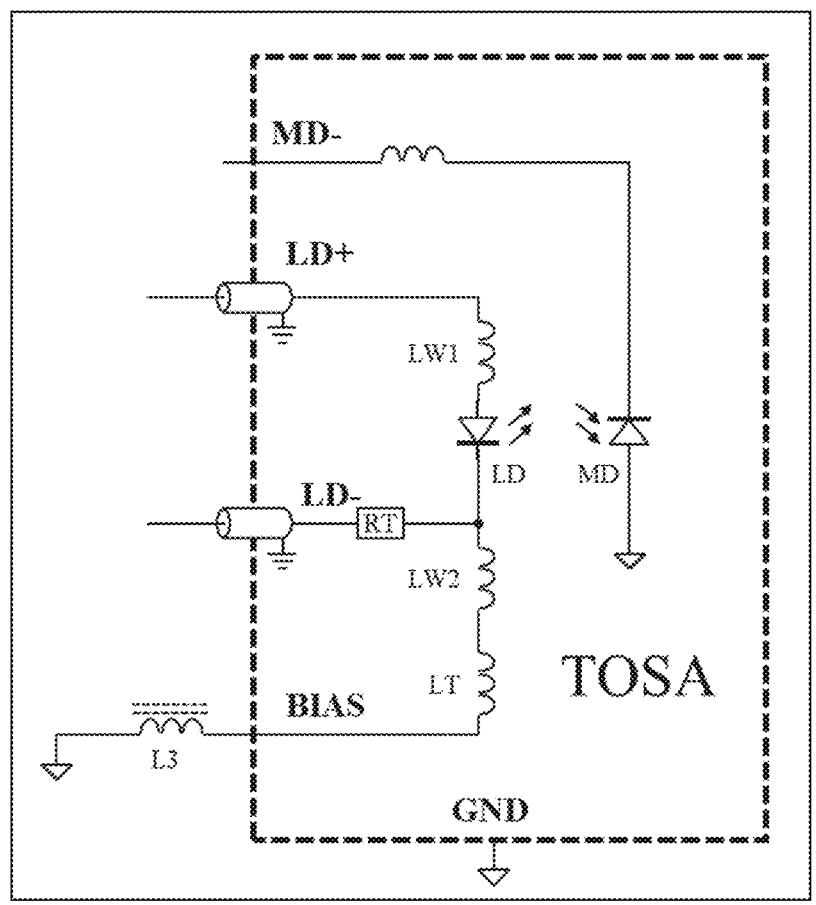
FIG. 7 is a circuit schematic illustrating an embodiment of a TOSA (e.g., TO-based TOSA) having a grounded monitor diode anode and one TO pin to bias the laser diode through an external inductor.
Figure 8:
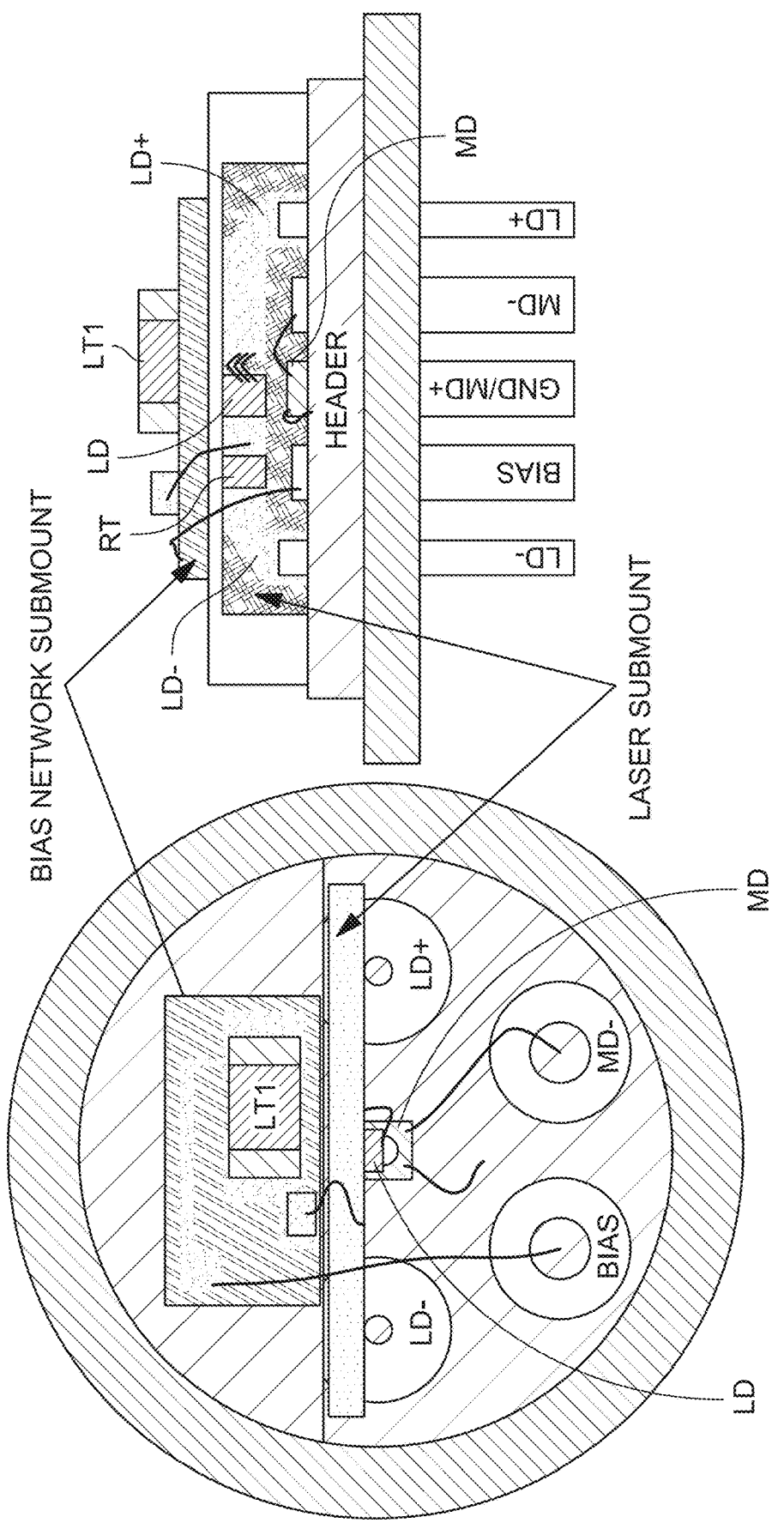
FIG. 8 illustrates an embodiment of a TOSA (e.g., TO-based TOSA) header that can be used for an implementation of the laser driver architecture described herein (e.g., embodiments shown in FIGS. 1A, 2, 3, 4, and 5), wherein the TOSA has a grounded monitor diode anode.

The laser driver architecture introduced here has an inductor element assembled close to laser cathode. For a widely used 5-pin TO-based TOSA, the inductor (LT) inside of the TOSA can be carefully selected to provide enough high frequency isolation and low frequency cut-off, so it can be terminated to ground in the TO header. FIG. 6 shows an implementation on a TO header, where an assembly example of a 5-pin TO-based TOSA with internal bias inductors is illustrated. In another implementation, the monitor diode anode (MD+) can be grounded to save one pin for BIAS. FIGS. 7 and 8 show a circuit schematic and an example of 5-pin TO-based TOSA assembly, respectively, where the monitor diode anode is grounded and the laser cathode is biased from the BIAS pin and an external inductor L3.

In embodiments, the laser driver architecture can be further simplified by integrating the discrete capacitor C2 into the TOSA. For example, an assembly can include a wafer cap asserted underneath the laser chip on the laser sub-mount, or just one series capacitor.

It is noted that the laser driver architecture discussed here is not limited to TO-based assemblies. The laser driver architecture can be used in other applications where high-performance, high-density and low-power are critical for optical modules.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:

1. A system for driving a transmitter optical sub-assembly, the transmitter optical sub-assembly configured to generate a laser, comprising:
    a driver chip comprising:
        first and second differential transistors, the first differential transistor configured to receive a first input signal, the second differential transistor configured to receive a second input signal, the first differential transistor configured to generate a first output signal, the second differential transistor configured to generate a second output signal, the first output signal and the second output signal for driving an operation of the transmitter optical sub-assembly;
        first and second internal inductors electrically coupled to the first and second differential transistors, respectively;
        first and second external inductor pins electrically coupled to the first and second internal inductors, respectively; and
    a current source configured to bias a first output path defined by a first external inductor electrically coupled to the first external inductor pin and the first internal inductor and a second output path defined by a second external inductor electrically coupled to the second external inductor pin and the second internal inductor, the first external inductor and the second external inductor electrically coupled in series to the first internal inductor and the second internal inductor, respectively,
    wherein the first output path is coupled to a first input of the transmitter optical sub-assembly and the second output path is coupled to a second input of the transmitter optical sub-assembly.

2. The system as recited in claim 1, wherein the first input of the transmitter optical sub-assembly feeds into a first input path including a laser diode.

3. The system as recited in claim 2, wherein the second input of the transmitter optical sub-assembly feeds into a second input path including a resistor coupled to the laser diode.

4. The system as recited in claim 3, wherein the second input path further includes a capacitor positioned before the resistor.

5. The system as recited in claim 1, wherein the current source is controlled by an automatic power control (APC) circuit to deliver a bias current of IBIAS+(l+k)·IMOD, where k is between 0 and 1.

6. A driver chip comprising:
    first and second differential transistors, the first differential transistor configured to receive a first input signal, the second differential transistor configured to receive a second input signal, the first and second differential transistors configured, respectively, to provide a first output signal and a second output signal, the first output signal and the second output signal directed to a transmitter optical sub-assembly;
    first and second internal inductors electrically coupled to the first and second collectors of the first and second differential transistors, respectively; and
    first and second external inductor pins electrically coupled in series to the first and second internal inductors, respectively,
    wherein a current source biases a first output path defined by a first external inductor electrically coupled to the first external inductor pin and the first internal inductor and a second output path defined by a second external inductor electrically coupled to the second external inductor pin and the second internal inductor, the first output path being coupled to a first input of the transmitter optical sub-assembly and the second output path being coupled to a second input of the transmitter optical sub-assembly.

7. The driver chip as recited in claim 6, wherein the second input path further includes a capacitor.

8. The system as recited in claim 6, wherein the current source is controlled by an automatic power control (APC) circuit to deliver a bias current of IBIAS+(l+k)·IMOD, where k is between 0 and 1.

* * * * *